(12) United States Patent
Kim (10) Patent No.: US 8,466,066 B2
(45) Date of Patent: Jun. 18, 2013

(54) METHOD FOR FORMING MICRO-PATTERN IN SEMICONDUCTOR DEVICE

(75) Inventor: Won-Kyu Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 532 days.

(21) Appl. No.: 12/493,179

(22) Filed: Jun. 27, 2009

(65) Prior Publication Data

US 2010/0120258 A1    May 13, 2010

(30) Foreign Application Priority Data

Nov. 13, 2008    (KR) .................. 10-2008-0112676

(51) Int. Cl.
*H01L 21/311*    (2006.01)
(52) U.S. Cl.
USPC ........................... 438/696; 438/700; 438/745
(58) Field of Classification Search
USPC ........................................................ 438/696
See application file for complete search history.

(56) References Cited

U.S. PATENT DOCUMENTS

| | | |
|---|---|---|
| 2007/0224819 A1 | 9/2007 | Sandhu |
| 2008/0017992 A1* | 1/2008 | Kito et al. ............ 257/773 |
| 2008/0057445 A1 | 3/2008 | Brueck et al. |
| 2009/0152645 A1* | 6/2009 | Tran ..................... 257/401 |
| 2009/0238000 A1* | 9/2009 | Juengling ............. 365/185.13 |

FOREIGN PATENT DOCUMENTS

| | | |
|---|---|---|
| CN | 101207037 | 6/2008 |
| CN | 101246845 | 8/2008 |
| CN | 101290867 | 10/2008 |
| KR | 1020050011210 | 1/2005 |
| TW | 200610096 | 3/2006 |
| WO | WO 2007/133442 | 11/2007 |

OTHER PUBLICATIONS

Notice of Allowance issued from Korean Intellectual Property Office on May 30, 2011.
Patent Certificate and Publication of granted Chinese invention issued by the Chinese Patent Office on Jul. 11, 2012.
Search Report and Notification for the Opinion of Re-examination issued from the Taiwanese Intellectual Property Office on Jul. 25, 2012.

* cited by examiner

*Primary Examiner* — Shamim Ahmed
*Assistant Examiner* — Bradford Gates
(74) *Attorney, Agent, or Firm* — IP & T Group LLP (57) ABSTRACT

A method for forming a micro-pattern in a semiconductor device includes forming a hard mask layer and a sacrificial layer over an etch target layer, forming a plurality of openings having a hole shape in the sacrificial layer, forming spacers over inner sidewalls of the openings to form first hole patterns inside the openings, etching the sacrificial layer outside of the sidewalls of the openings using the spacers in a manner that the sacrificial layer in a first area remains partially and the sacrificial layer in a second area is removed to form second hole patterns, wherein the first area is smaller than the second area, and etching the hard mask layer using the remaining sacrificial layer and the spacers including the first and second hole patterns.

7 Claims, 14 Drawing Sheets

METHOD FOR FORMING MICRO-PATTERN IN SEMICONDUCTOR DEVICE

CROSS-REFERENCE TO RELATED APPLICATIONS

The present invention claims priority of Korean patent application number 10-2008-0112676, filed on Nov. 13, 2008, the disclosure of which is incorporated herein by reference in its entirety.

BACKGROUND OF THE INVENTION

The present invention relates to a semiconductor technology, and more particularly, to a method for forming a micro-pattern in a semiconductor device in which a micro hole pattern having dimensions smaller than the allowed resolution is formed.

The semiconductor industry is growing at a rapid rate as semiconductor devices are becoming highly integrated and efficient. Such a rapid growth in turn has increased the demand for large-scale integration and efficiency of semiconductor devices.

Fabricating semiconductor devices includes repeatedly performing deposition process, ion implantation process, photo process, etching process, and cleaning process to form desired circuit patterns on a semiconductor substrate and certain material layers. Thus, large-scale integration and efficiency may be achieved when a sufficient level of technology for each of the processes is provided.

The etching process is one of the essential process technologies needed when forming a submicron circuit pattern having a relatively satisfactory etch profile.

Recently, double patterning technology has been introduced to form a submicron pattern with dimensions smaller than the allowed resolution.

The double patterning technology includes performing a photolithography process to form a pattern twice the size of a desired pitch and performing another round of photolithography process to further form patterns among the existing pattern, thereby forming the patterns with the desired pitch.

However, the critical dimension (CD) uniformity is determined by the overlay accuracy among masks used during the photolithography processes because the photolithography processes are performed twice.

Thus, self-aligned double patterning technology has been introduced to overcome the above-discussed limitation of the double patterning technology.

The self-aligned double patterning technology includes patterning a hard mask layer to form a hard mask pattern twice the size of a desired pitch, forming spacers over sidewalls of the hard mask pattern, removing the hard mask pattern, and etching lower layers using the spacers as masks to form a pattern of the desired pitch.

The self-aligned double patterning technology may be able to increase the CD uniformity because the process involved uses the photolithography process once. However, the current level of technology allows the self-aligned double patterning technology to be applied mostly to line patterns and generally not to hole patterns.

SUMMARY OF THE INVENTION

Exemplary embodiments of the present invention are directed to providing a method for forming a micro-pattern in a semiconductor device, which can form a micro hole pattern of below the limiting resolution.

In accordance with an aspect of the present invention, there is provided a method for forming a micro-pattern in a semiconductor device includes forming a hard mask layer and a sacrificial layer over an etch target layer, forming a plurality of openings having a hole shape in the sacrificial layer, forming spacers over inner sidewalls of the openings to form first hole patterns inside the openings, etching the sacrificial layer outside of the sidewalls of the openings using the spacers in a manner that the sacrificial layer in a first area remains partially and the sacrificial layer in a second area is removed to form second hole patterns, wherein the first area is smaller than the second area, and etching the hard mask layer using the remaining sacrificial layer and the spacers including the first and second hole patterns.

BRIEF DESCRIPTION OF THE DRAWINGS

FIGS. 1A to 7C illustrate plan and cross-sectional views of a method for forming a micro-pattern in a semiconductor device in accordance with an embodiment of the present invention.

DESCRIPTION OF SPECIFIC EMBODIMENTS

Other objects and advantages of the present invention can be understood by the following description, and become apparent with reference to the embodiments of the present invention.

Embodiments of the present invention relate to a method for forming a micro-pattern in a semiconductor device, which can form a micro hole pattern having a pitch smaller than the allowed resolution using self-aligned double patterning technology.

Furthermore, the method includes performing a photolithography process once. Thus, undesirable critical dimensions (CD) which were often generated by misalignment of photo-exposure masks when using a typical double patterning technology may be reduced. Also, the cost may be decreased because the number of photo-exposure process being performed is reduced.

The embodiments of the present invention will be described in detail with reference to the accompanying drawings so that those ordinary persons skilled in the art may be able to embody the present invention with ease. Also, regarding the drawings, the illustrated thickness of layers and regions are exemplary and may not be exact. When a first layer is referred to as being on a second layer or "on" a substrate, it could mean that the first layer is formed right on the second layer or the substrate, or it could also mean that a third layer may exist between the first layer and the substrate. Furthermore, the same or like reference numerals through out the various embodiments of the present invention represent the same or like elements in different drawings.

FIGS. 1A to 7C illustrate plan and cross-sectional views of a method for forming a micro-pattern in a semiconductor device. FIGS. 1A, 2A, 3A, 4A, 5A, 6A, and 7A represent plan views of the semiconductor device, FIGS. 1B, 2B, 3B, 4B, 5B, 6B, and 7B represent cross-sectional views of the semiconductor device shown in FIGS. 1A, 2A, 3A, 4A, 5A, 6A, and 7A taken along a line I-I', respectively, and FIGS. 1C, 2C, 3C, 4C, 5C, 6C, and 7C represent cross-sectional views of the semiconductor device shown in FIGS. 1A, 2A, 3A, 4A, 5A, 6A, and 7A taken along a line II-II', respectively.

Figure 1A:
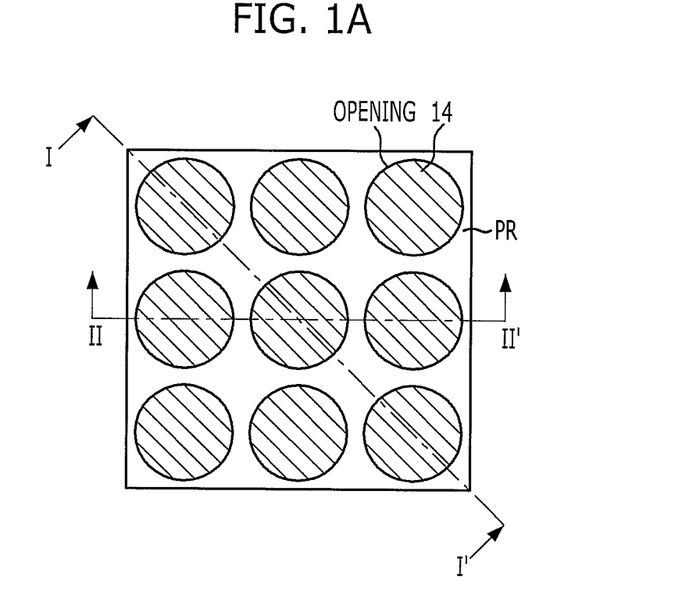
Figure 1B:
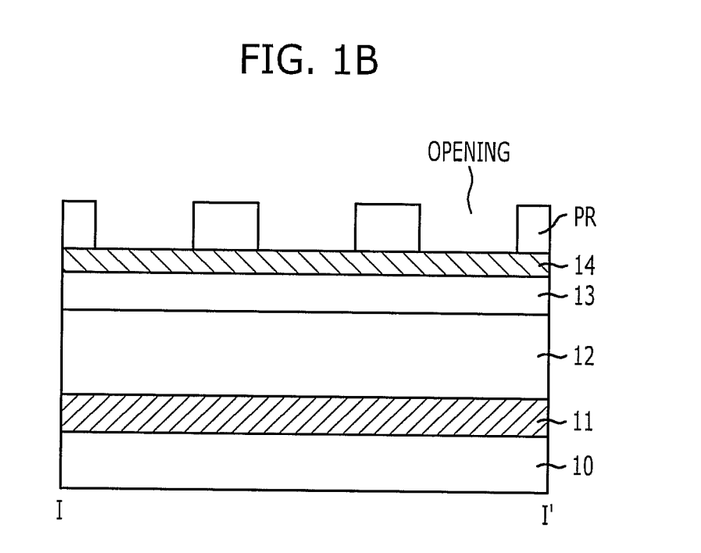
Figure 1C:
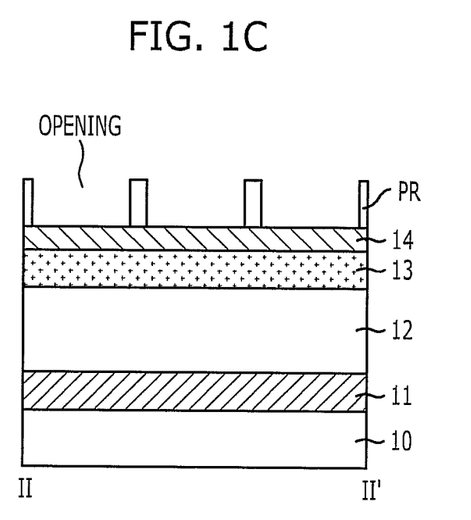

Referring to FIGS. 1A to 1C, a first hard mask layer 11, a second hard mask layer 12, and a sacrificial layer 13 are formed over an etch target layer 10.

The first hard mask layer 11 is formed to reduce the impact on the etch target layer 10, which may be generated from a slope of subsequent hole patterns (shown in FIGS. 7A, 7B, and 7C), which are to be formed in the second hard mask layer 12. The first hard mask layer 11 may include one of a carbon layer, a polysilicon layer, and an oxide-based layer.

Figure 3A:
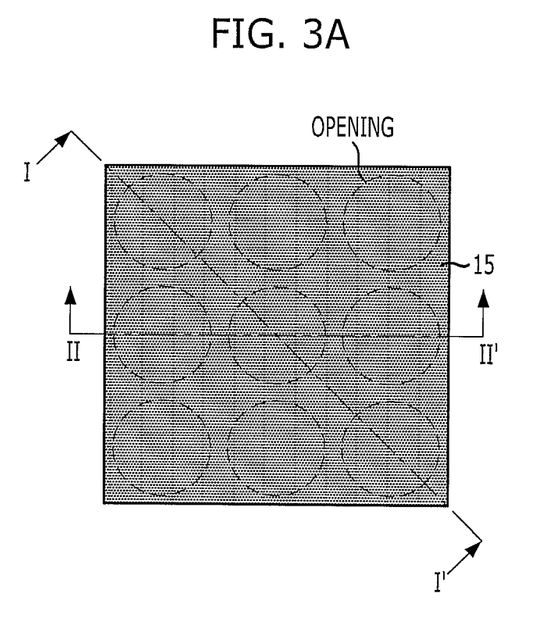
Figure 3B:
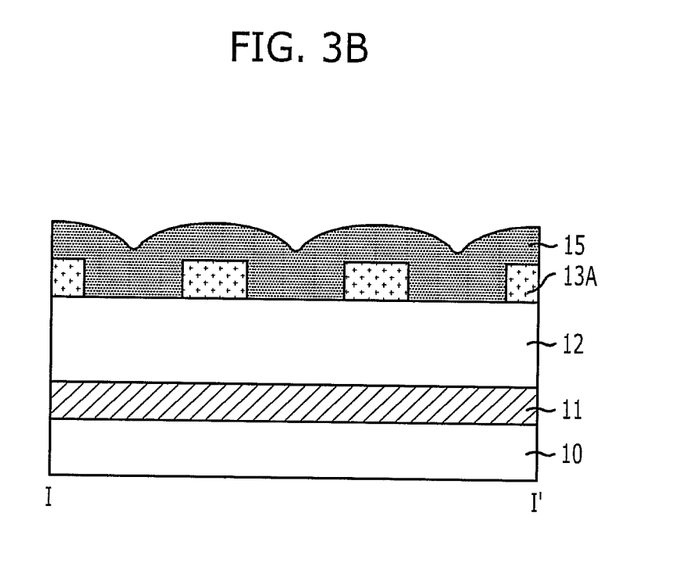
Figure 3C:
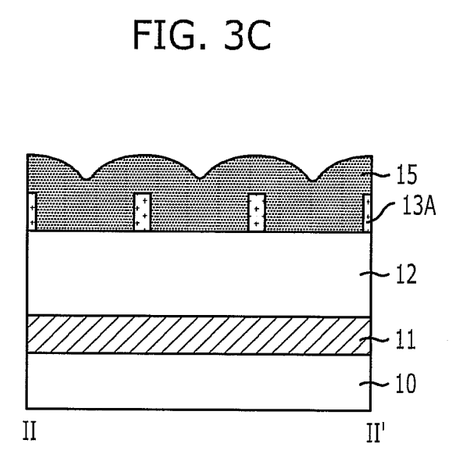

The second hard mask layer 12 includes a material having an etch selectivity with respect to the first hard mask layer 11, the sacrificial layer 13, and a subsequent spacer layer 15 (shown in FIGS. 3A, 3B, and 3C). For instance, if the first hard mask layer 11 includes an oxide-based layer, the second hard mask layer 12 is formed to include one of a polysilicon layer and a nitride-based layer, and if the first hard mask layer 11 includes a polysilicon layer, the second hard mask layer 12 is formed to include an oxide-based layer.

The sacrificial layer 13 may include a carbon layer.

A photoresist layer is formed over the sacrificial layer 13. Photo-exposure and developing processes are performed to pattern the photoresist layer to form a photoresist pattern PR having trench-shaped openings. Before forming the photoresist pattern PR, a bottom anti-reflective coating layer 14 may be additionally formed.

A cross-sectional view along the line I-I', where the spacing distance among the openings is relatively large, refers to a cross-sectional view in a direction along a major axis, and another cross-sectional view along the line II-II', where the spacing distance among the openings is relatively small (e.g., smaller than the same in FIG. 1B), refers to a cross-sectional view in a direction along a minor axis.

Figure 2A:
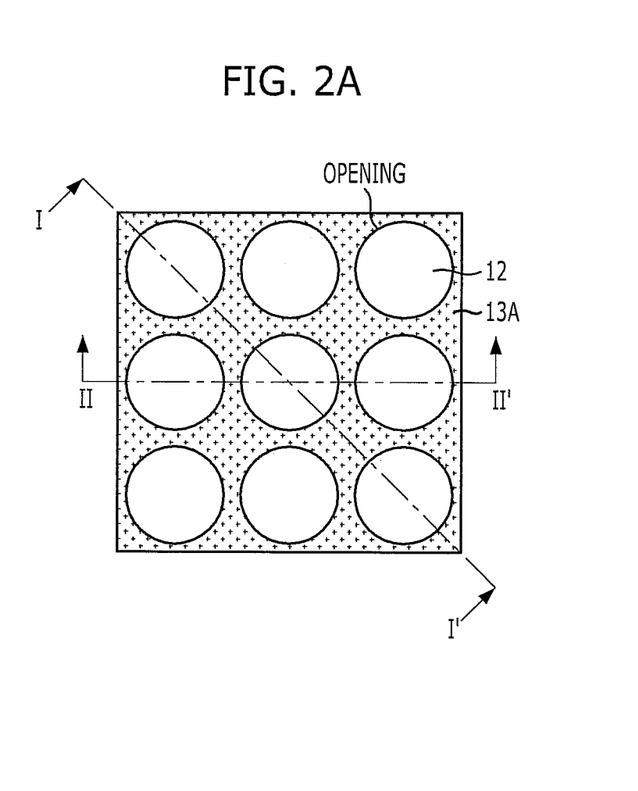
Figure 2B:
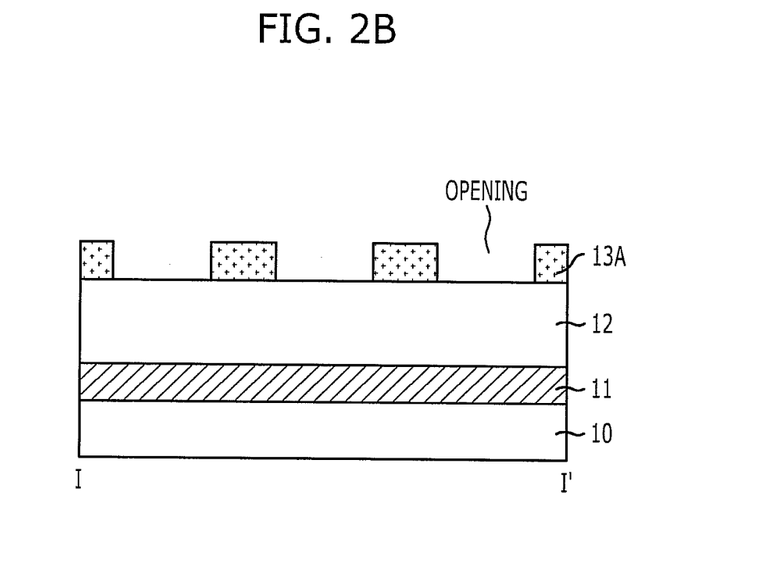
Figure 2C:
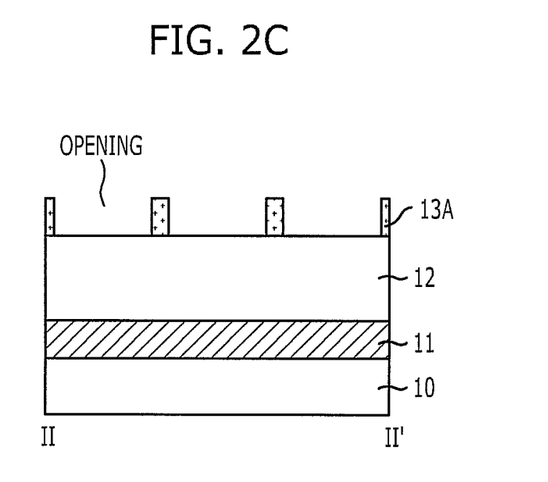

Referring to FIGS. 2A to 2C, the bottom anti-reflective coating layer 14 and the sacrificial layer 13 are etched using the photoresist pattern PR as a mask.

At this time, because the sacrificial layer 13 is etched using the photoresist pattern PR having the trench-shaped openings as a mask, the openings of the photoresist pattern PR are mirrored onto the sacrificial layer 13, thereby forming trench-shaped openings in the sacrificial layer 13. Reference numeral 13A represents a sacrificial pattern 13A.

A photoresist removal process is performed to remove the photoresist pattern PR and remaining portions of the bottom anti-reflective coating layer 14. A post cleaning process is performed.

At this time, if the sacrificial pattern 13A includes a material that is easily removable by the photoresist removal process, the photoresist removal process may be omitted.

Referring to FIGS. 3A to 3C, the spacer layer 15 is formed over the substrate structure.

The spacer layer 15 includes a material with a step coverage of approximately 0.9 or greater and having an etch selectivity with respect to the sacrificial pattern 13A and the second hard mask layer 12. For instance, the spacer layer 15 may include one of an oxide-based layer and a polysilicon layer.

The spacer layer 15 is formed using a certain deposition gas at a certain temperature, where the temperature may be selected to not have a negative effect on the sacrificial pattern 13A. For instance, if the sacrificial pattern 13A includes a carbon layer, the sacrificial pattern 13A may shrink and deform when the spacer layer 15 is formed at a high temperature. Therefore, the spacer layer 15 may be formed at a low temperature ranging from approximately 25° C. to approximately 300° C. Also, the spacer layer 15 may be formed using a gas which may not have a negative effect on the sacrificial pattern 13A so that the sacrificial pattern 13A may not be removed by the gas used during the formation of the spacer layer 15.

Figure 4A:
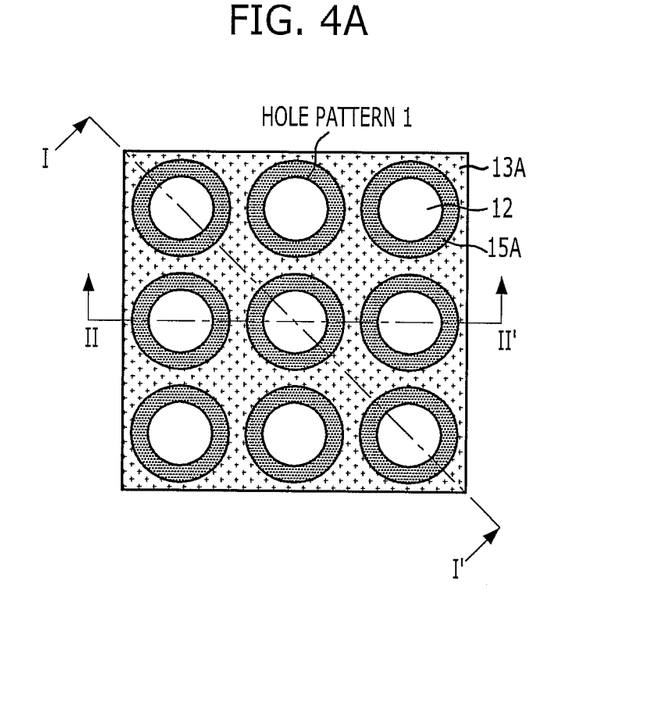
Figure 4B:
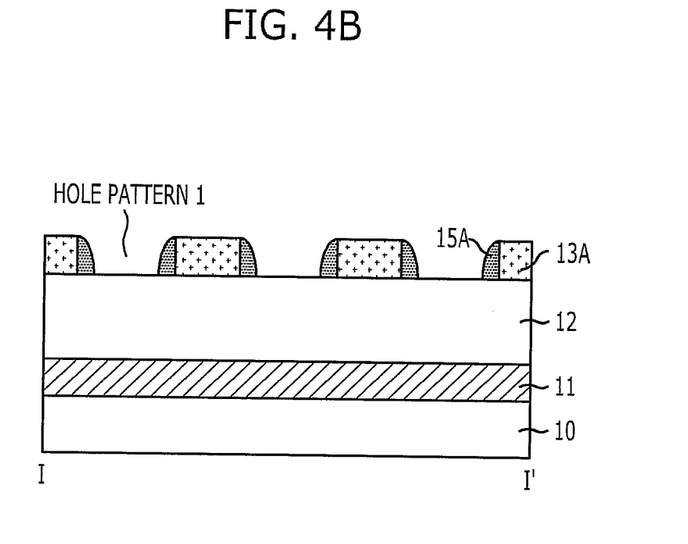
Figure 4C:
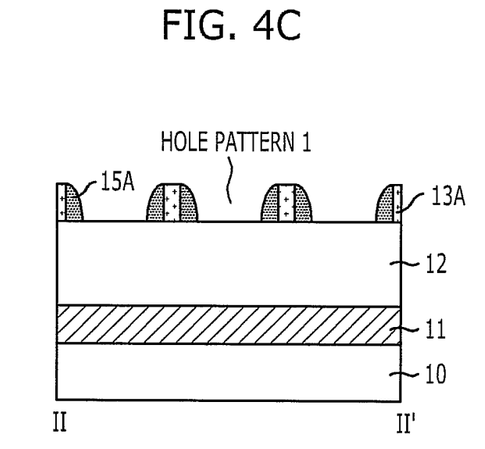

Referring to FIGS. 4A to 4C, an etch-back process is performed on the spacer layer 15 to form spacers 15A over inner sidewalls of the trench-shaped openings formed in the sacrificial pattern 13A.

Thus, first hole patterns, as represented by reference denotation 'HOLE PATTERN 1', are formed inside the openings. The first hole patterns have a diameter which is smaller than that of the openings by twice the width of the spacers 15A.

Figure 5A:
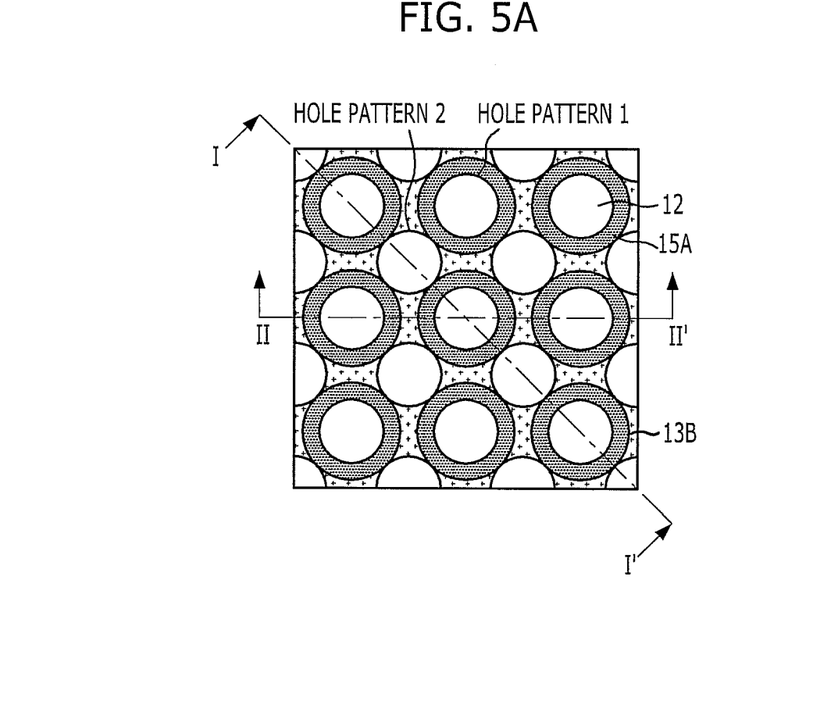
Figure 5B:
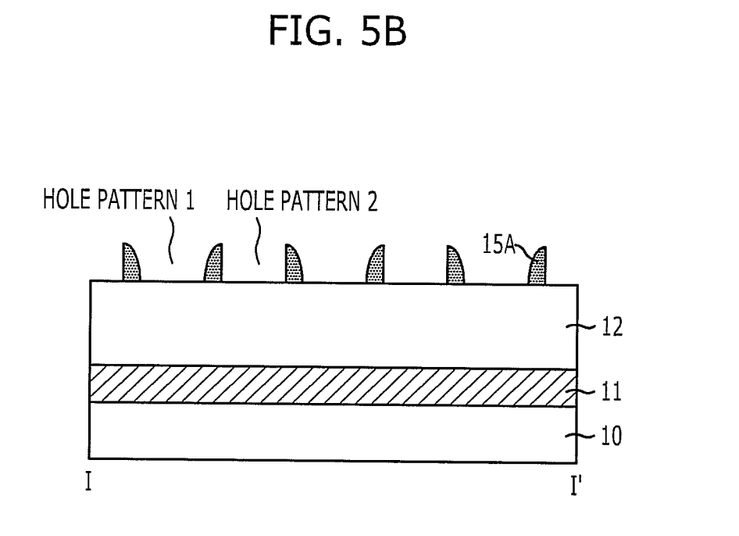
Figure 5C:
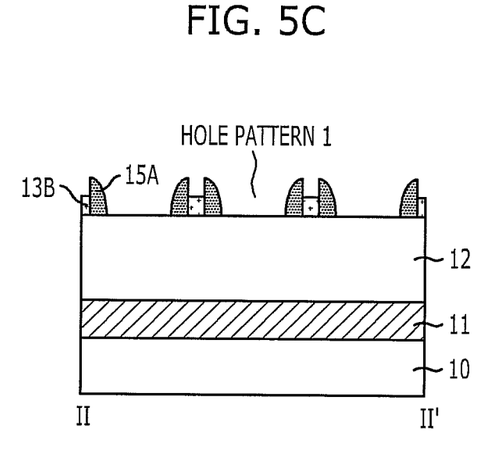

Referring to FIGS. 5A to 5C, an etch process using the spacers 15A as a mask is performed to remove portions of the sacrificial pattern 13A formed between the spacers 15A where the spacing distance among the spacers 15A is relatively large to form second hole patterns, as represented by reference denotation 'HOLE PATTERN 2'. At this time, other portions of the sacrificial pattern 13A formed between the spacers 15A where the spacing distance among the spacers 15A is relatively small partially remain. Reference numeral 13B represents a remaining sacrificial pattern 13B. The etch process may include an etch-back process or a wet dip process.

When etching the sacrificial pattern 13A, due to the etch rate difference among etch targets according to different spacing distance of the mask, portions of the sacrificial pattern 13A remain along the minor axis, i.e., along the II-II' line, where the spacing distance among the spacers 15A is relatively small, but other portions of the sacrificial pattern 13A are removed along the major axis, i.e., along the I-I' line, where the spacing distance among the spacers 15A is relatively large, thereby forming the second hole patterns along the major axis.

Consequently, the second hole patterns are formed in a structure where the second hole patterns are self-aligned to the first hole patterns with the spacers 15A formed in-between along the major axis. Thus, the number of hole patterns doubled along the major axis.

Figure 6A:
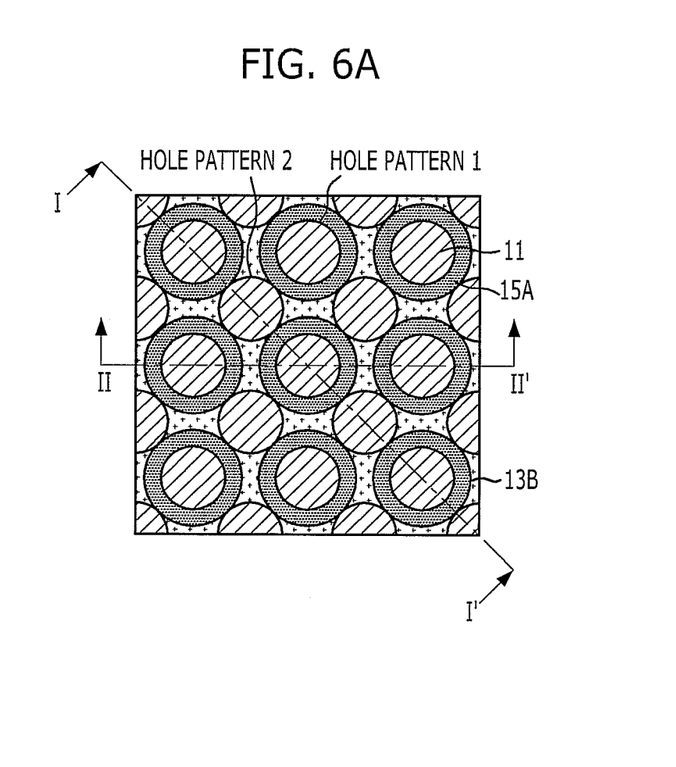
Figure 6B:
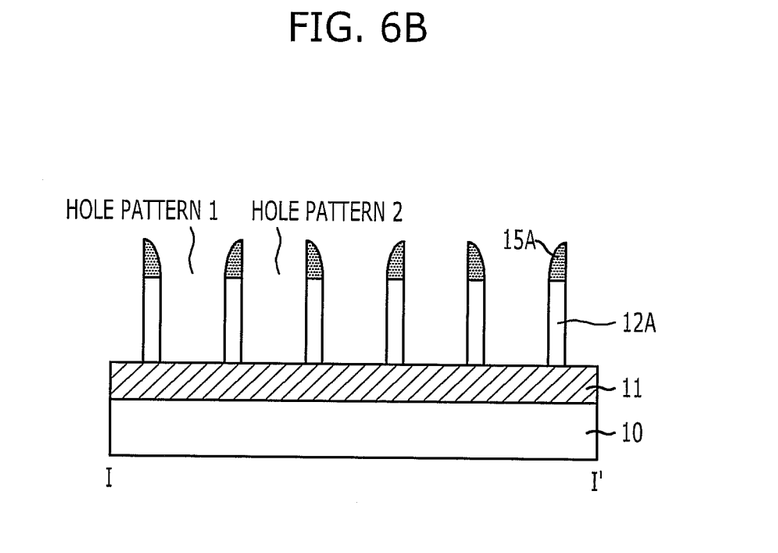
Figure 6C:
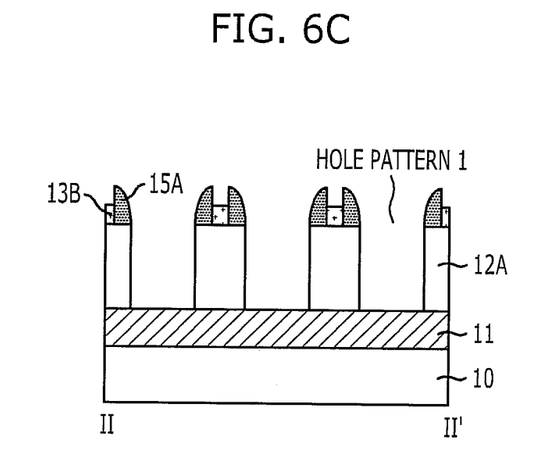

Referring to FIGS. 6A to 6C, the second hard mask layer 12 is etched using the remaining sacrificial pattern 13B and the spacers 15A including the first and second hole patterns as a mask. Reference numeral 12A represents a second hard mask pattern 12A.

Thus, the first and second hole patterns are mirrored onto the second hard mask layer second hard mask layer 12, thereby forming the first and second hole patterns in the second hard mask pattern 12A.

Figure 7A:
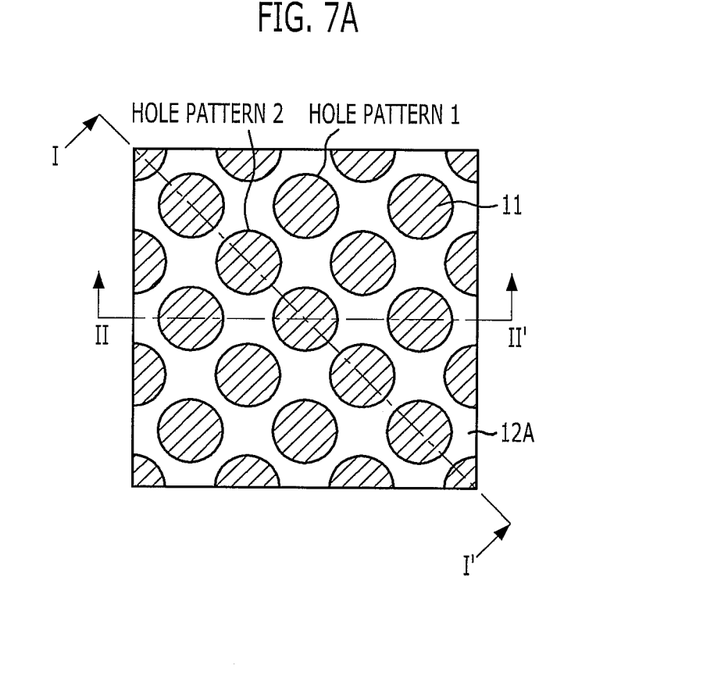
Figure 7B:
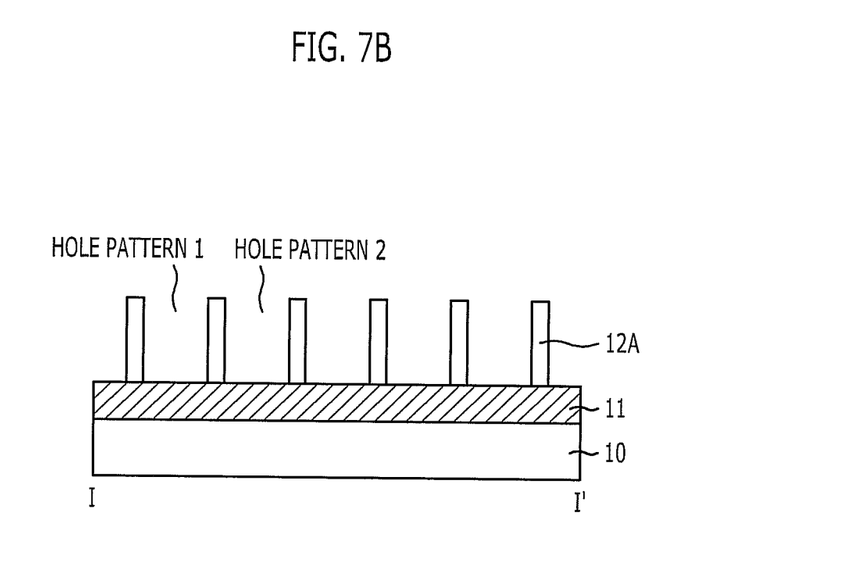
Figure 7C:
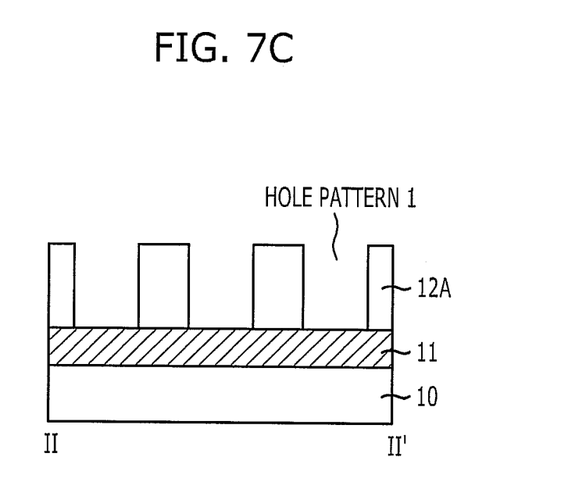

Referring to FIGS. 7A to 7C, the spacers 15A and the remaining sacrificial pattern 13B are removed.

Although not illustrated, if the first and second hole patterns formed in the second hard mask pattern 12A are etched to have a slope, the first hard mask layer 11 may be patterned using the second hard mask pattern 12A as a mask and the etch target layer 10 may be etched using remaining portions of the first hard mask layer 11 as an etch barrier so that the sloped first and second hole pattern may not have an effect on the etch target layer 10.

At this time, if the first and second hole patterns are formed in the second hard mask pattern 12A without a slope, formation of the first hard mask layer 11 may be omitted. In this case, the etch target layer 10 may be etched using the second hard mask pattern 12A as an etch barrier.

In accordance with the embodiment of the present invention, a micro hole pattern having a pitch smaller than the allowed resolution may be formed using the self-aligned double patterning technology.

Furthermore, because the photo process is performed once, undesirable critical dimensions (CD) among patterns which were often generated by misalignment of photo-exposure masks when using a typical double patterning technology may be reduced. Also, the cost may be decreased because the number of photo-exposure process being performed is reduced.

While the present invention has been described with respect to the specific embodiments, it will be apparent to those skilled in the art that various changes and modifications may be made without departing from the spirit and scope of the invention as defined in the following claims.

What is claimed is:

1. A method for forming a micro-pattern in a semiconductor device, comprising:

forming a hard mask layer and a sacrificial layer over an etch target layer;

forming a plurality of openings having a hole shape in the sacrificial layer;

forming spacers over inner sidewalls of the openings to form first hole patterns inside the openings;

etching the sacrificial layer outside of the sidewalls of the openings using the spacers in a manner that the sacrificial layer in a first area remains partially and the sacrificial layer in a second area is removed to form second hole patterns in the second area, wherein a space between adjacent ones of the spacers in the first area is smaller than a space between adjacent ones of the spacers in the second area; and etching the hard mask layer using the remaining sacrificial layer and the spacers including the first and second hole patterns, wherein the etching of the sacrificial layer is performed by using an etch rate difference that occurs due to differences in distances between adjacent ones of the spacers, wherein a first etch rate for etching the sacrificial layer in the second area is greater than a second etch rate for etching the sacrificial layer in the first area when the sacrificial layer is exposed for etching in both the first and second areas.

2. The method of claim 1, wherein the etching of the sacrificial layer to form the second hole patterns comprises performing one of an etch-back process and a wet dip process.

3. The method of claim 1, further comprising, after the etching of the hard mask layer:

removing the remaining sacrificial layer and the spacers; and etching the etch target layer using the etched hard mask layer.

4. The method of claim 1, wherein the etch rate of the sacrificial layer in the second area is greater than that in the first area.

5. The method of claim 1, wherein the second area is a cross-section of the semiconductor device along a major axis of the semiconductor device.

6. The method of claim 1, wherein the first area is a cross-section of the semiconductor device along a minor axis of the semiconductor device.

7. The method of claim 1, wherein the number of hole patterns formed by the remaining sacrificial layer and the spacers in the second area is greater than the number of hole patterns formed by the remaining sacrificial layer and the spacers in the first area.

* * * * *